(12) United States Patent
Cheng et al.

(10) Patent No.: US 6,946,860 B2
(45) Date of Patent: Sep. 20, 2005

(54) MODULARIZED PROBE HEAD

(75) Inventors: Shih-Jye Cheng, Hsinchu (TW);
An-Hong Liu, Tainan (TW);
Yeong-Her Wang, Tainan (TW);
Yeong-Ching Chao, Taichung (TW);
Yao-Jung Lee, Tainan (TW)

(73) Assignees: ChipMOS Technologies (Bermuda) Ltd., Hamilton (BM); ChipMOS Technologies Inc., Hsinchu (TW)

( * ) Notice: Subject to any disclaimer, the term of this patent is extended or adjusted under 35 U.S.C. 154(b) by 104 days.

(21) Appl. No.: 10/680,230

(22) Filed: Oct. 8, 2003

(65) Prior Publication Data

US 2005/0088190 A1    Apr. 28, 2005

(51) Int. Cl.[7] .................... G01R 31/02; G01R 31/26
(52) U.S. Cl. .................... 324/755; 324/765
(58) Field of Search .................... 324/754, 755, 324/757, 758, 765, 158.1; 439/65, 67–72

(56) References Cited

U.S. PATENT DOCUMENTS

| | | | |
|---|---|---|---|
| 5,070,297 A | * | 12/1991 | Kwon et al. ................ 324/754 |
| 5,497,079 A | * | 3/1996 | Yamada et al. ........... 324/158.1 |
| 6,359,456 B1 | | 3/2002 | Hembree et al. ............ 324/754 |
| 6,621,710 B1 | * | 9/2003 | Cheng et al. ................ 361/774 |
| 6,781,392 B1 | * | 8/2004 | Cheng et al. ................ 324/754 |

* cited by examiner

*Primary Examiner*—Vinh Nguyen
*Assistant Examiner*—Russell M. Kobert
(74) *Attorney, Agent, or Firm*—Birch, Stewart, Kolasch & Birch, LLP

(57) ABSTRACT

A modularized probe head for modularly assembling on a probe card is configured for probing a semiconductor wafer under test. The probe head includes a silicon substrate having an active surface and an opposing back surface. The back surface of the silicon substrate is attached on a holder. The silicon substrate has a plurality of peripheral bond pads and contact pads on its active surface. At least a probing chip is mounted on the active surface of the silicon substrate. The probing chip has probing tips and side electrodes. The side electrodes are connected with the contact pads by means of solder material. The peripheral bonding pads of the silicon substrate are connected with a flexible printed circuit for electrically connecting to a multi-layer printed circuit board of a probe card.

7 Claims, 3 Drawing Sheets

MODULARIZED PROBE HEAD

FIELD OF THE INVENTION

The present invention relates to a probe head configured for assembling on a probe card for probing a semiconductor wafer under test.

BACKGROUND OF THE INVENTION

Conventionally, a probe head is assembled on a probe card for probing the semiconductor wafer under test. The conventional probe card comprises a probe head and a multi-layer printed circuit board shaped like a disk. Because the contact elements of probe head, such as probe needles or probing bumps, are required to contact the bonding pads of a wafer precisely, the precision and the matching of coefficient of thermal expansion of a probe head is higher than that of other probe card components. Therefore, the probe head is a key component of a probe card.

A probe card with a probe head containing an interconnect substrate with raised contact members is disclosed in U.S. Pat. No. 6,359,456. The interconnect substrate is made of silicon by semiconductor fabricating process. Conductive circuits and raised contact members are formed on the active surface of interconnect substrate as a probe head. There is no electric connection formed on the corresponding back surface of interconnect substrate, the conductive circuits of interconnect substrate are formed on the active surface with contact members and extend to edges of the active surface. The conductive circuits of interconnect substrate are connected by bonding wires to a mounting plate, and then use a membrane to connect the mounting plate to testing apparatus. The bonding wires and the membrane provide a hoop height higher than the active surface of the silicon interconnect substrate. While the raised contact members on the active surface of interconnect substrate probing the electrodes of a wafer under test, however, these bonding wire or flexible membrane are possibly to contact and rub against the wafer under test, which may damage the wafer under test and also affecting the testing results.

SUMMARY OF THE INVENTION

A main purpose of the present invention is to provide a modularized probe head including a silicon substrate installed with a plurality of probing chips. The silicon substrate is attached on a holder. Each probing chip has a plurality of probing tips and a plurality of side electrodes to be a testing unit. These side electrodes are joined with the silicon substrate by solder material in order to rework easily when one of the probing chips is fail, and to improve the member universality of the test head.

The modularized probe head according to the present invention mainly comprises a holder, a silicon substrate, at least a probing chip and at least a flexible printed circuit. The holder has a bottom surface and internal side surfaces surrounding the bottom surface to hold the silicon substrate. The silicon substrate has an active surface and an opposing back surface, wherein the active surface is forming with a plurality of peripheral bonding pads, contact pads and connecting circuits. A solder material is formed upon the peripheral bond pads and contact pads. The probing chip is fabricated or installed on the active surface of the silicon substrate. The probing chip contains a plurality of first probing tips and a plurality of side electrodes that are joined with the solder material forming on the corresponding contact pads. The flexible printed circuit has a first end and a second end, wherein the first end is joined on the corresponding peripheral bond pads, and the second end is extended through the internal side surfaces of the holder to form a modularized probe head.

DETAIL DESCRIPTION OF THE INVENTION

Figure 1:
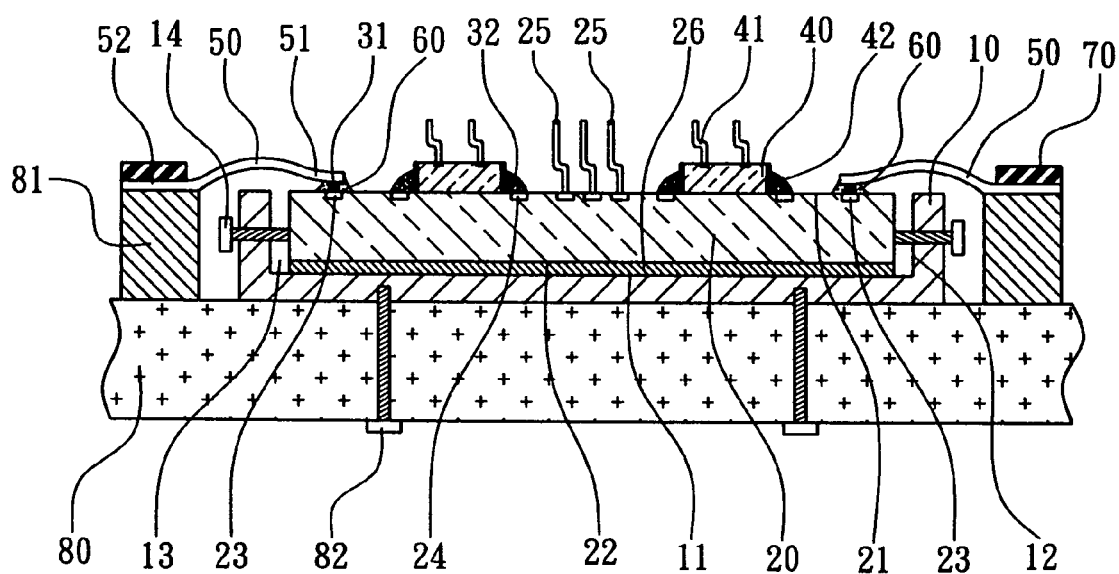
FIG. 1 is a cross-sectional view of a modularized probe head in accordance with the present invention.
Figure 2:
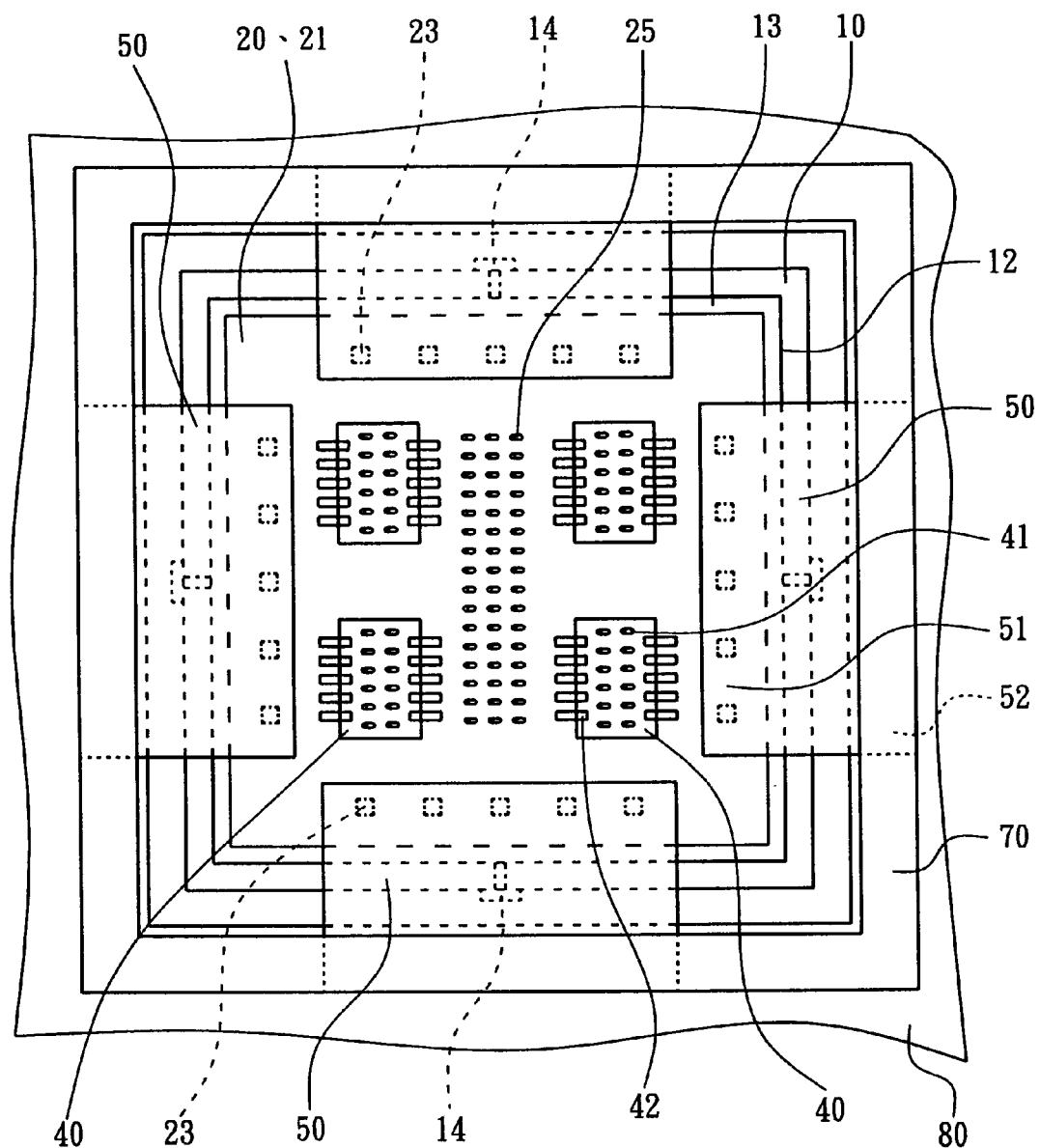
FIG. 2 is a front view of a modularized probe head in accordance with the present invention.

Please refer to the drawings attached, the present invention will be described by means of an embodiment below. According to the present invention, a modularized probe head mainly comprises a metal holder 10, a silicon substrate 20, at least a probing chip 40 and at least a flexible printed circuit 50, as shown in FIGS. 1 and 2, wherein the metal holder 10 is an alloyed metal holder, such as aluminum alloy. The metal holder 10 is a mechanically connecting base of the probe head for mounting with a multi-layer printed circuit board 80. The metal holder 10 has a bottom surface 11 and internal side surfaces 12 surrounding the bottom surface 11 for accommodating the silicon substrate 20.

The silicon substrate 20 is disposed on the metal holder 10. The silicon substrate 20 has same coefficients of thermal expansion as that of a wafer under test, and it can be fabricated to form test circuitry by semiconductor fabricating process. In this embodiment, the silicon substrate 20 has an active surface 21 forming with IC circuits and an opposing back surface 22, wherein the active surface 21 contains a plurality of peripheral bonding pads 23, a plurality of contact pads 24 and connecting circuits. Each of the peripheral bonding pads 23 and contact pad 24 is forming with a solder material 31, 32. The back surface 22 of silicon substrate 20 is attached on the bottom surface 11 of metal holder 10. It is preferable that a stress buffer layer 26 is formed between the back surface 22 of the silicon substrate 20 and the bottom surface 11 of the holder 10. An adjustable gap 13 is formed between the internal side surfaces 12 of holder 10 and the silicon substrate 20. Use the adjusting mechanism 14 through the internal side surfaces 12, such as adjusting screws, to micro-adjust the relative position of the silicon substrate 20 and the holder 10. The active surface 21 of the silicon substrate 20 is mounted with a plurality of probing chips 40.

These probing chips 40 are as chip-probing units of the probe head corresponding to each chip region of wafer under test. Each probing chip 40 has a plurality of first probing tips 41 and a plurality of side electrodes 42. The first probing tips 41 could be vertical probe needles, elastic probe needles, cantilever needles or probing bumps, and bonded on the upper surface of the probing chip 40. The arranged position of the first probing tips 41 is corresponding to that of the bonding pads of a wafer under test. These side electrodes 42 are installed on the laterals of the probing chip and electrically connecting with the corresponding first probing tips 41. Solder material 32 connects the side electrodes 42 with the contact pads 24 of the silicon substrate 20 by Surface Mounting Technology (SMT). Furthermore, the active surface 21 of the silicon substrate 20 could also be formed with at least a second probing tip 25 for probing the wafer under test.

The flexible printed circuit 50 (FPC) acts as an electrical connector between the silicon substrate 20 of the probe head and connector 81 of the multi-layer printed circuit board 80. The flexible printed circuit 50 has a first end 51 and a second end 52. The first end 51 is formed with a plurality of metal fingers, which are joined with the corresponding peripheral bonding pads 23 by solder material 31. It is preferable that an insulated material 60 is dispensed between the first side 51 of the flexible printed circuit 50 and the silicon substrate 20 to fix the joining points of solder material 31. The second end 52 is extended through the internal side surfaces 12 of the holder 10 to connect to the multi-layer printed circuit board 80. In this embodiment, the holder 10 is mechanically connected with the multi-layer printed circuit board 80 with fixtures 82 such as screws. The flexible printed circuit 50 is fixed with a FPC connector 70, and the second side 52 of the flexible printed circuit 50 is combined with a connector 81 of the multi-layer printed circuit board 80 in plug-in and plug-out type.

Therefore, according to the present invention the probing chip 40 having a plurality of first probing tips 41 is mounted on the active surface 21 of the silicon substrate 20, and the side electrodes 42 of the probing chip 40 is joined by solder material 32 with the contact pad 24 of the silicon substrate 20. Under this structure, the height difference between the flexible printed circuit 50 and the first probing tips 41 can be increased, and would not affect the tips of the first probing tips 41. Furthermore, the position of the first probing tip 41 of probing chip 40 can be defined using the same photo mask for the bonding pads, which is the passivation openings of the wafer under test, in order to reduce the cost of photomasks due to different positions of bonding pads of different wafers under test. Therefore, it does not need to redesign a new silicon substrate 10, that is, the silicon substrate 10 according to the present invention can be standardized and universal. While a wafer with various distribution positions of bonding pads or changing the dimension of bonding pads, it only necessary to join with the corresponding probing chip 40 on an universal silicon substrate 10, without redesigning another new probe head. Besides, the side electrodes 42 of the probing chip 40 are joined with the silicon substrate 10 by solder material 32 in order to rework easily when one of the probing chips 40 is fail.

Figure 3:
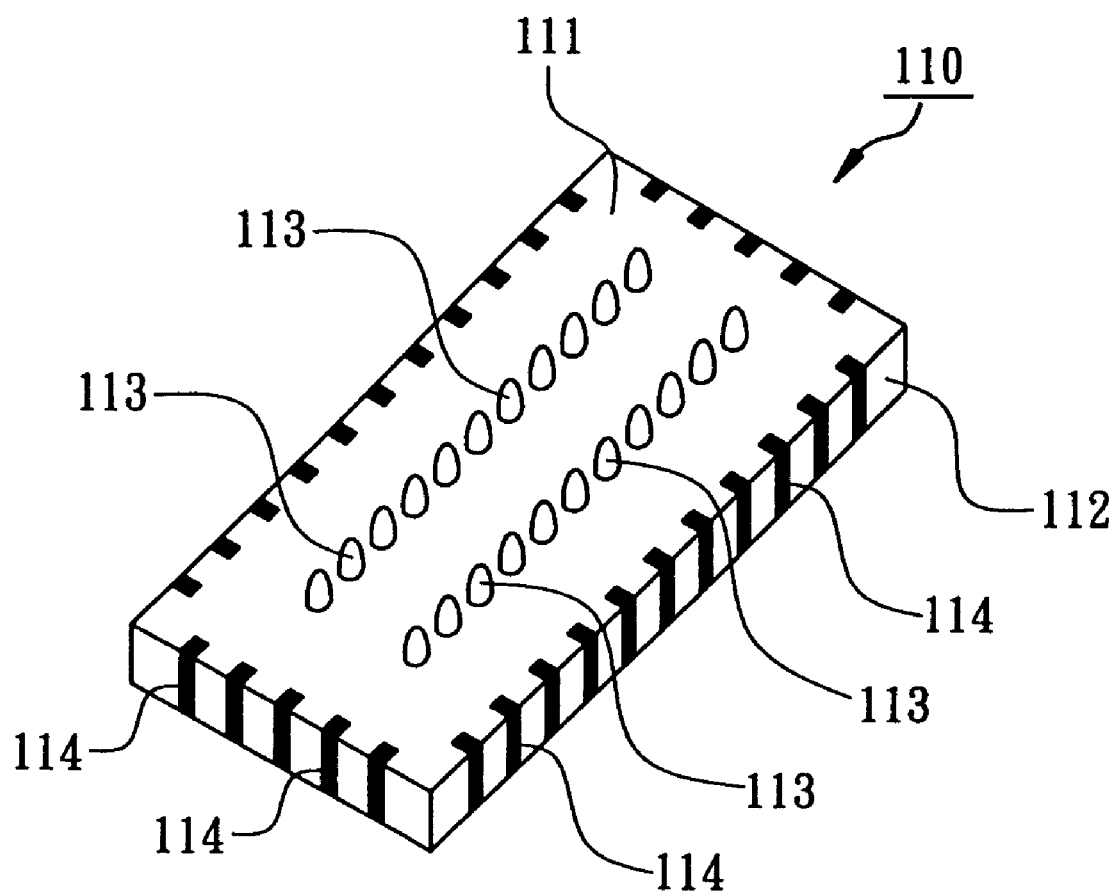
FIG. 3 is a three-dimensional view of a probing chip of a modularized probe head in accordance with the present invention.

Furthermore, in another embodiment, as shown in FIG. 3, a probing chip 110 according to the present invention is provided for mounting on the active surface 21 of the silicon substrate 20. The probing chip 110 is a probing module, having a probing surface 111, an opposing back surface and laterals 112 between the probing surface 111 and the back surface. The probing surface 111 of the probing chip 110 is forming with a plurality of probing tips 113. The laterals 112 of the probing chip 110 are forming with a plurality of side electrodes 114. These side electrodes 114 are strip like, and it is preferable that these side electrodes 114 pass through and exposed on the probing surface 111 and the back surface. When the probing chip 110 is mounted on the silicon substrate 20, the contact pads 24 of the silicon substrate 20 are electrically connected with the side electrodes 114 by solder material 32. When there is extra solder material 32, it would climb up the side electrodes 114 due to surface tension of solder material 32, and thus reduces the problem of short bridging of solder materials 32 between the contact pads 24. It also has a lower connection height, and would not affect the probing of the probing tips 113.

The above description of embodiments of this invention is intended to be illustrative and not limiting. Other embodiments of this invention will be obvious to those skilled in the art in view of the above disclosure.

What is claimed is:

1. A modularized probe head comprising:
   a holder with a bottom surface and a plurality of internal side surfaces surrounding the bottom surface;
   a silicon substrate having an active surface and an opposing back surface, wherein the active surface is forming with a plurality of peripheral bonding pads, a plurality of contact pads and connecting circuits, and the silicon substrate is disposed on the bottom surface of the holder;
   at least a probing chip mounted on the active surface of the silicon substrate, wherein the probing chip has a plurality of first probing tips and a plurality of side electrodes;
   a solder material connecting the side electrodes of the probing chip and the contact pads of the silicon substrate; and
   at least a flexible printed circuit having a first end and a second end, wherein the first end is connected with the corresponding bonding pads of the silicon substrate, and the second end is extended through the internal side surfaces of the holder.

2. The modularized probe head according to claim 1, wherein a gap is formed between the internal surfaces of the holder and the silicon substrate.

3. The modularized probe head according to claim 1, further comprising at least a second probing tip formed on the active surface of the silicon substrate.

4. The modularized probe head according to claim 1, further comprising a FPC connector at the second end of the flexible printed circuit.

5. The modularized probe head according to claim 1, further comprising an insulated material for fixing the first end of the flexible printed circuit on the silicon substrate.

6. The modularized probe head according to claim 1, wherein the probing chip has a probing surface, an opposing back surface and a plurality of laterals between the probing surface and the back surface, the first probing tips are formed on the probing surface, the side electrodes are formed on the laterals.

7. The modularized probe head according to claim 6, wherein the side electrodes are exposed on the probing surface and the back surface.

* * * * *